US007511537B2

(12) United States Patent
Kimura (10) Patent No.: US 7,511,537 B2
(45) Date of Patent: Mar. 31, 2009

(54) COMPARATOR CIRCUIT FOR REDUCING CURRENT CONSUMPTION BY SUPPRESSING GLITCHES DURING A TRANSITIONAL PERIOD

(75) Inventor: Hiroyuki Kimura, Sendai (JP)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 11/869,750

(22) Filed: Oct. 10, 2007

(65) Prior Publication Data

US 2008/0106305 A1    May 8, 2008

(30) Foreign Application Priority Data

Nov. 7, 2006    (JP)    ............... 2006-301829

(51) Int. Cl.
*H03D 13/00* (2006.01)
(52) U.S. Cl. ......................................... 327/40; 327/63
(58) Field of Classification Search .................. 327/40, 327/63
See application file for complete search history.

(56) References Cited

U.S. PATENT DOCUMENTS 5,414,310 A * 5/1995 Fattaruso ...................... 327/62

6,806,744 B1 * 10/2004 Bell et al. ...................... 327/70

FOREIGN PATENT DOCUMENTS

JP    8078975 A    3/1996
JP    2002217691 A    8/2002

* cited by examiner

*Primary Examiner*—Kenneth B Wells
*Assistant Examiner*—John W Poos
(74) *Attorney, Agent, or Firm*—Charles Bergere

(57) ABSTRACT

A comparator circuit for reducing current consumption in a low consumption mode while suppressing the generation of glitches during a transitional period. The comparator circuit includes a comparison core circuit unit, a monitor circuit unit formed by a first transistor, and a nonlinear amplification circuit. The comparison core circuit includes second and third transistors connected to a constant current source. The source terminal and gate terminal of the first transistor have the same connection as the source terminal and gate terminal of the third transistor. The current flowing to the first transistor is supplied to the nonlinear amplification circuit. The nonlinear amplification circuit amplifies the supplied current with an incorporated constant current source and supplies the amplified current to the source terminals of the second and third transistors of the comparison core circuit.

3 Claims, 6 Drawing Sheets

$$Io3 \fallingdotseq i2 \cdot (1-\exp(-\frac{Ii3}{Is3}))$$

Fig.11

COMPARATOR CIRCUIT FOR REDUCING CURRENT CONSUMPTION BY SUPPRESSING GLITCHES DURING A TRANSITIONAL PERIOD

BACKGROUND OF THE INVENTION

The present invention relates to a comparator circuit for comparing a plurality of input voltages and performing an output that is in accordance with the comparison.

A comparator circuit compares a plurality of input signals and outputs a signal that is in accordance with the comparison. The output signal may be in correspondence with the operation status of a circuit incorporating the comparator circuit. For example, when a circuit is entirely in a standby state, the comparator circuit may output a low level signal In this case, the circuit is not in an operational state. Thus, it is desirable that current consumption be reduced. Accordingly, measures are taken to reduce current consumption in the comparator circuit, which is part of the circuit.

Figure 1:
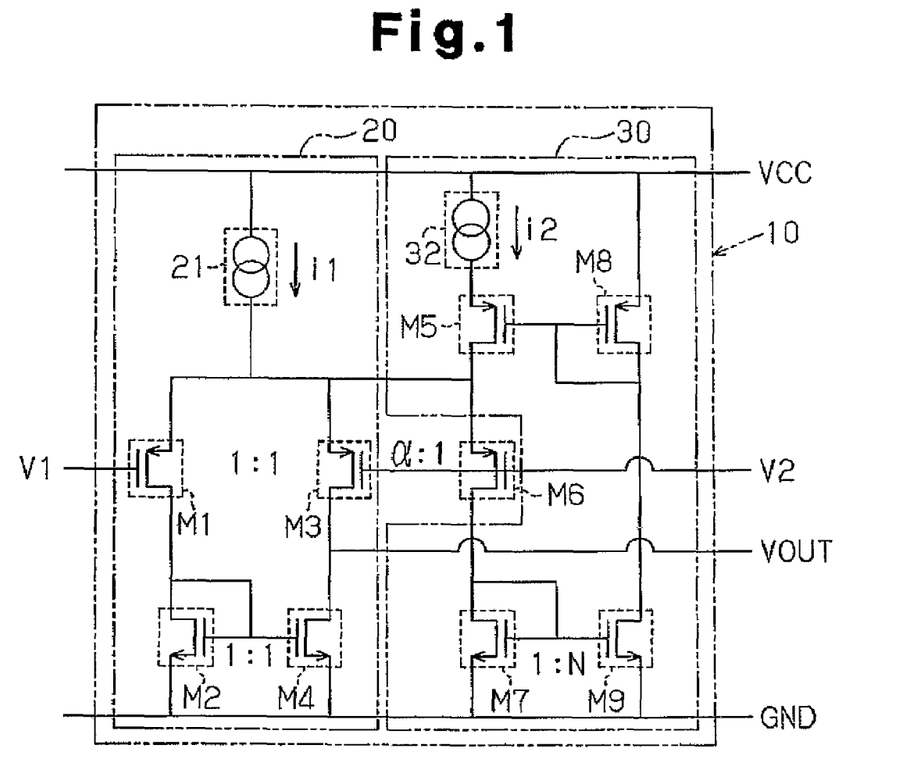
FIG. 1 is a circuit diagram of a comparator circuit according to a preferred embodiment of the present invention.

Japanese Laid-Open Patent Publication No. 8-78975, FIG. 1, describes a comparator circuit including a differential amplifier, a current amplifier, a constant current circuit, and a constant current control circuit. The differential amplifier compares two input signals to amplify and output the voltage difference of the input signals. The current amplifier amplifies the current of the differential amplifier output. The constant current circuit supplies constant current to the differential amplifier and the current amplifier. The constant current control circuit detects the output of the differential amplifier and controls the constant current circuit. Further, the constant current control circuit includes a switch circuit, which is operated in accordance with low level and high level outputs, and a switch control circuit for controlling the switch circuit. In the comparator circuit, the switch circuit is activated and deactivated to change the amount of current that flows through the constant current circuit. Thus, glitches may be generated when switching is performed with the switch circuit, that is, when switching the output of the comparator circuit.

Japanese Laid-Open Patent Publication No. 2002-217691, FIG. 1, describes a comparator circuit for comparing input voltage and a reference voltage. The comparator circuit, which is activated when supplied with bias current, includes a bias enforcement circuit for adding bias current and outputting bias enforcement current. The comparator circuit outputs current that is in accordance with the state of the current from the bias enforcement circuit. Accordingly, the comparator circuit differs from that of Japanese Laid-Open Patent Publication No. 8-78975 in that the generation of glitches is suppressed.

The comparator circuit described in Japanese Laid-Open Patent Publication No. 8-78975 is configured so that current does not flow to the differential amplifier in a low current consumption mode. However, this results in the necessity to increase the current that flows to the constant current control circuit. It is thus difficult to suppress current consumption in the entire comparator circuit.

In the comparator circuit described in Japanese Laid-Open Patent Publication No. 2002-217691, the bias enforcement circuit, which monitors the current state, is constantly supplied with current. Thus, in a low current consumption mode, the reduction in current consumption is insufficient.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF THE PREFERRED EMBODIMENT

The present invention provides a comparator circuit that reduces current consumption in the low current consumption mode while suppressing the generation of glitches when switching the output.

One aspect of the present invention is a comparator including a comparison core circuit unit having an output terminal for varying an output level in accordance with a voltage difference between a first voltage input to a gate terminal of a first transistor and a second voltage input to a gate terminal of a second transistor. The comparator includes a monitor circuit unit for outputting monitor current in accordance with the amount of current flowing through the second transistor in a transitional state in which the current amount changes and for stopping the flow of the monitor current when the second voltage is higher than the first voltage and current does not flow to the second transistor. A nonlinear amplification circuit unit increases the monitor current in a nonlinear manner and adds a bias for operating the comparison core circuit unit.

Other aspects and advantages of the present invention will become apparent from the following description, taken in conjunction with the accompanying drawings, illustrating by way of example the principles of the invention.

A preferred embodiment of the present invention will now be described with reference to FIGS. 1 to 10.

As shown in FIG. 1, a comparator circuit 10 of the preferred embodiment is a comparator for comparing a first voltage V1 of a positive input terminal with a second voltage V2 of a negative input terminal. The positive input terminal corresponds to a first terminal, and the negative input terminal corresponds to a second terminal. The comparator circuit 10 of the preferred embodiment generates an output voltage VOUT having a high level when the voltage V1 is higher than the voltage V2 and generates an output voltage VOUT having a low level when the voltage V1 is lower than the voltage V2.

The comparator circuit 10 includes a comparison core circuit unit 20, a monitor circuit unit formed by a transistor M6, and a nonlinear amplification circuit unit 30.

The comparison core circuit unit 20 includes a constant current source 21, which is connected to a power supply voltage VCC line. The constant current source 21 generates current having a current value i1. Further, the constant current source 21 is connected to a ground voltage GND line via transistors M1 and M2 and via transistors M3 and M4.

The transistors M1 and M3 are formed by p-channel MOS transistors, and the transistors M2 and M4 are formed by n-channel MOS transistors. In this embodiment, the transistors M1 and M3 have the same size, and the transistors M2 and M4 have the same size.

The gate terminal of the transistor M1 is supplied with the voltage V1 of the positive input terminal. Further, the gate terminal of the transistor M3 is supplied with the voltage V2 of the negative input terminal. The gate terminals of the transistors M2 and M4 are connected to each other and to the drain terminal of the transistor M2. The transistors M2 and M4 form a first current mirror circuit. Accordingly, the current value of the current flowing through the transistors M3 and M4 is determined by the one of the transistors M3 and M4 through which a smaller current flows. More specifically, when the current flowing through the transistor M4 is less than that flowing through the transistor M3, the current of which current value is determined by the transistor M4 flows through the transistors M3 and M4. Further, the current determined by the transistor M4 is the output current of the first current mirror circuit and is equal to the current flowing through the transistors M1 and M2 (i.e., input current of the first current mirror circuit). When the current flowing through the transistor M4 is greater than that flowing through the transistor M3, the current of which current value is determined by the transistor M3 flows through the transistors M3 and M4.

In the preferred embodiment, the drain terminals of the transistors M3 and M4 function as an output terminal of the comparator circuit 10 for outputting the output voltage VOUT. When current does not flow out of the output terminal, the same current flows to the transistor M1 and the transistor M2, and the same current flows to the transistor M3 and the transistor M4.

In the preferred embodiment, the transistor M6 functioning as the monitor circuit unit is a p-channel MOS transistor and has a size that is 1/α the size of the transistors M1 and M3. The transistor M6 has a source terminal connected to the source terminals of the transistors M1 and M3 and a gate terminal supplied with the voltage V2.

The nonlinear amplification circuit unit 30 amplifies monitor current, which is supplied from the transistor M6, in a nonlinear manner and supplies the amplified current to the comparison core circuit unit 20. The nonlinear amplification circuit unit 30 includes a transistor M7, which is connected to the drain terminal of the transistor M6. The transistor M7 is an n-channel MOS transistor. The transistor M7 has a source terminal connected to the ground voltage GND line and a gate terminal connected to the drain terminal of the transistor M7.

Further, the nonlinear amplification circuit unit 30 includes a transistor M9, the source terminal of which is connected to the ground voltage GND line. The transistor M9 is an n-channel MOS transistor and has a size that is N times greater than that of the transistor M7. The gate terminal of the transistor M9 is connected to the gate terminal of the transistor M7. The transistors M7 and M9 form a second current mirror circuit. Further, since the transistor M9 is N times larger than the transistor M7, current that is N times greater than the current flowing through the transistor M7 flows through the transistor M9 to be output as the output current of the second current mirror circuit.

The drain terminal of the transistor M9 is connected to the power supply voltage VCC line via a transistor M8. The gate terminal of the transistor M8 is connected to its drain terminal and to the gate terminal of a transistor M5. The transistor M8 is a p-channel MOS transistor. The transistor M8 and the transistor M5 form a third current mirror circuit.

The transistor M5 is a p-channel MOS transistor having the same size as the transistor M8. The transistor M5 has a drain terminal connected to the source terminals of the transistors M1, M3, and M6 and a source terminal connected to the power supply voltage VCC line via a constant current source 32. The constant current source 32 supplies the transistor M5 with current having current value i2.

Figure 2:
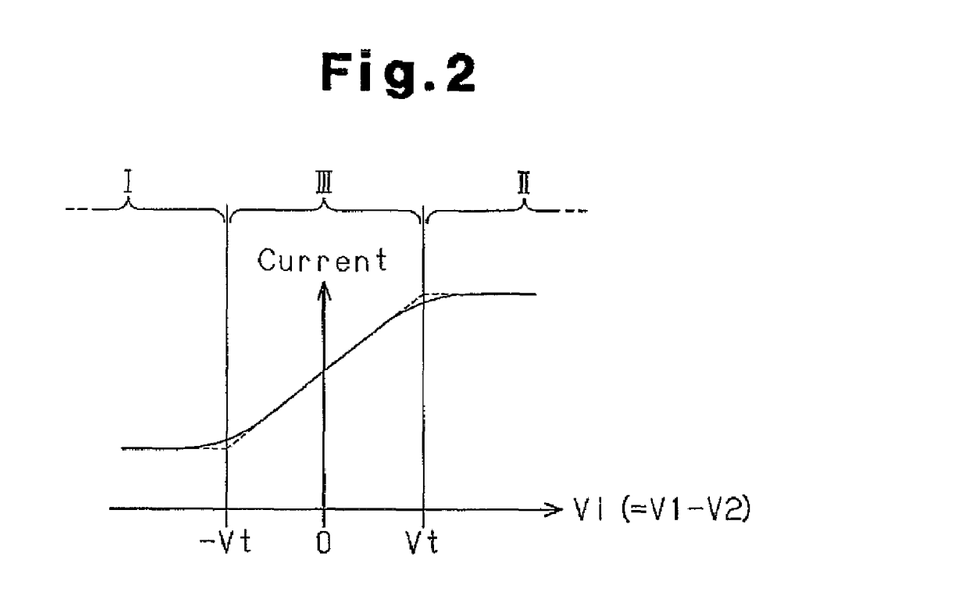
FIG. 2 is a chart showing the operational range of the comparator circuit.

The operation of the comparator circuit 10 in three operational ranges will now be discussed. Referring to FIG. 2, the three operational ranges are a first range I, a second range II, and a third range III. In the first range I, the voltage V2 at the negative input terminal is significantly higher than the voltage V1 at the positive input terminal. In the second range II, the voltage V2 is significantly lower than the voltage VI. The third range III is a range of transition between the first range I and the second range II.

Figure 3:
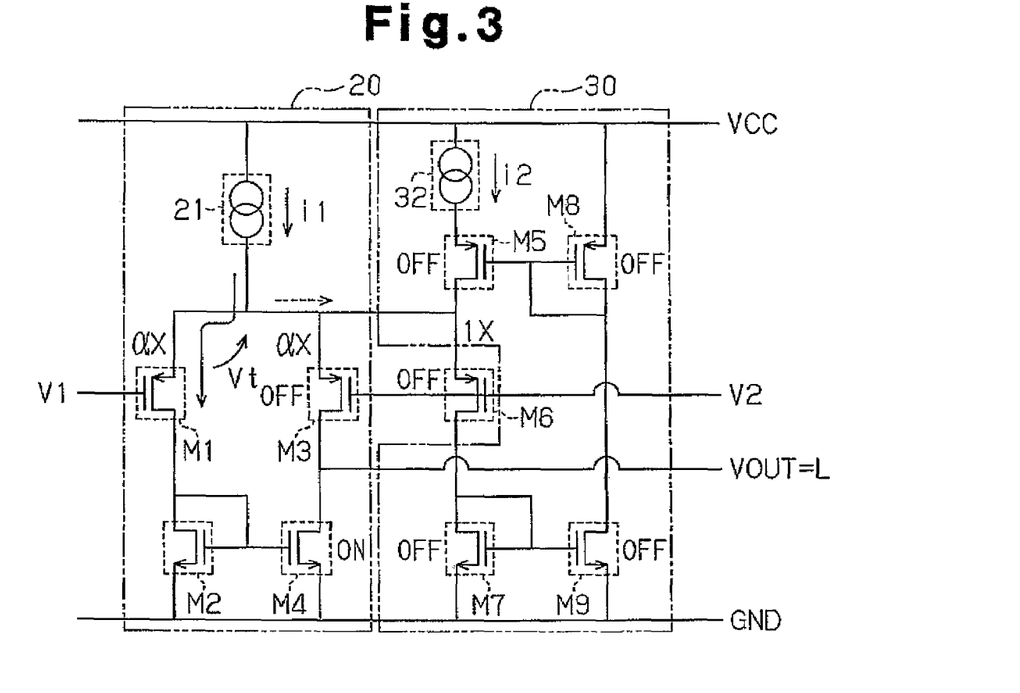
FIG. 3 is a circuit diagram illustrating the operation of the comparator circuit in a first range I.

The operation of the comparator circuit 10 in the first range I in which the voltage V2 is significantly higher than the voltage V1 and current does not flow through the transistor M3 serving as a second transistor will now be described with reference to FIG. 3.

The voltages at the source terminals of the transistors M1 and M3 are equal. This deactivates the transistor M3 of which source-gate voltage difference is small and activates the transistor M1 of which source-gate voltage difference is large. Thus, current flows from the constant current source 21 to the transistor M1 but not to the transistor M3.

The current flowing to the transistor M1 further flows to the transistor M2. This activates the transistor M4, which forms a current mirror circuit with the transistor M2, so that the transistor M4 functions to cause the flow of the same current. Since the transistor M3 is deactivated, current does not flow from the transistor M3 to the transistor M4. Accordingly, the drain terminal of the transistor M4 becomes equal to the ground voltage GND due to the transistor M4. This causes the output voltage VOUT to have a low level.

In the same manner as the transistor M3, the transistor M6, the gate terminal of which is supplied with the voltage V2, is deactivated. Since current does not flow through the transistor M6, current does not flow through the transistor M7. This deactivates the transistor M7. Thus, current does not flow through the transistor M9, which forms a current mirror circuit with the transistor M7. Further, current does not flow through the transistor M8, which is connected to the transistor M9. This deactivates the transistor M8. Also, current does not flow through the transistor M5, which forms a current mirror circuit with the transistor M8. This deactivates the transistor M5. Thus current does not flow to the nonlinear amplification circuit unit 30.

Accordingly, in the first range I, the consumption current of the comparator circuit 10 is only the current that has the current value i1 and flows from the constant current source 21. Thus, the consumption current is constant.

Figure 4:
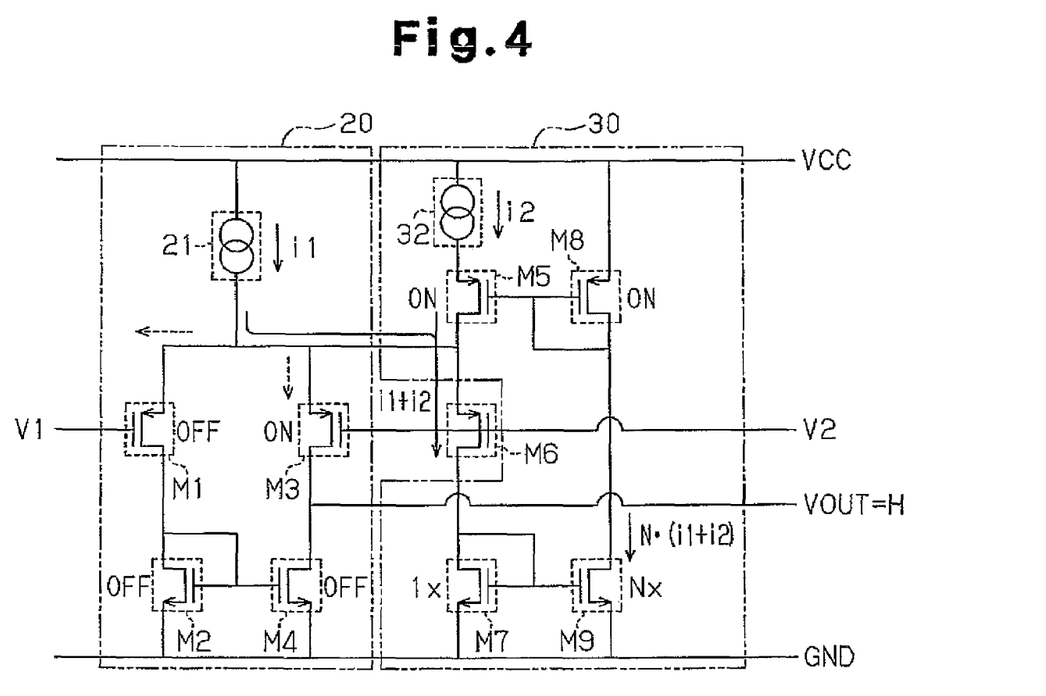
FIG. 4 is a circuit diagram illustrating the operation of the comparator circuit in a second range II.

Next, the operation of the comparator circuit 10 in the second range II in which the voltage V2 is significantly lower than the voltage V1 and current does not flow through the transistor M1 serving as a first transistor will now be described with reference to FIG. 4.

The voltages at the source terminals of the transistors M1 and M3 are equal. This activates the transistor M3 of which source-gate voltage difference is large and deactivates the transistor M1 of which source-gate voltage difference is small. Thus, current does not flow from the constant current source 21 to the transistor M1.

Since current does not flow to the transistor M1, current also does not flow to the transistor M2, which is connected to the transistor M1. This deactivates the transistor M2 and the transistor M4, which forms a current mirror circuit with the transistor M2.

In this state, the transistor M3 is activated and the transistor M4, which is connected to the transistor M3, is deactivated. Thus, current does not flow through the transistors M3 and M4. As a result, the transistor M3 and the constant current source 21 increase the voltage at the drain terminal of the transistor M3 and cause the output voltage VOUT to have a high level.

Current does not flow through the transistors M1 and M3. Thus, the current from the constant current source 21 is supplied to the transistor M6. The current supplied to the transistor M6 is further supplied to the transistor M7. This activates the transistor M7 and the transistor M9, which forms a current mirror circuit with the transistor M7. Current that is N times greater than the current flowing through the transistor M7 flows through the transistor M9. The current flows via the transistor M8 and thus activates the transistor M8. The current further flows to the transistor M5, which forms a current mirror circuit with the transistor M8. This activates the transistor M5.

When the transistor M5 is activated, current having current value i2 flows from the constant current source 32. In this state, current does not flow through the transistors M1 and M3. Thus, current is supplied from the constant current source 32 to the transistor M6.

Accordingly, in the second range II, the consumption current of the comparator circuit 10 is constant and equal to the sum of the current flowing from the constant current sources 21 and 32 (i1 and i2) and the current flowing through the transistors M8 and M9 (N·(i1+i2)).

The operation of the comparator circuit 10 in the third range III, which is a range of transition between the first range I and the second range II, will now be described with reference to FIGS. 5 to 10.

Figure 5:
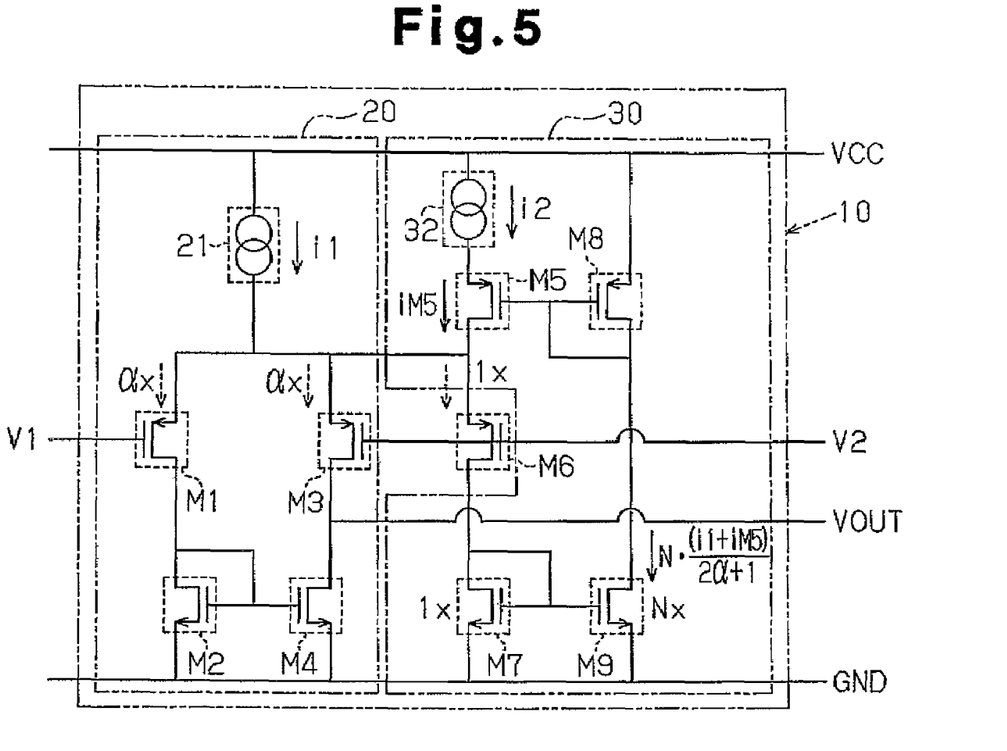
FIG. 5 is a circuit diagram illustrating the operation of the comparator circuit in a third range III.

First, a state in which the voltage V1 and the voltage V2 are equal to each other (V1−V2=Vi=0) will be described. In this case, in the transistors M1 and M3, the voltages at the source terminals are equal, and the voltages at the gate terminals are equal. Accordingly, the same current flows through the transistors M1 and M3. Further, the current flowing through the transistors M1 and M3 also flows through the transistors M2 and M4.

The transistors M1 and M3 are a times larger than the transistor M6. Accordingly, current that is a times greater than the current flowing through the transistor M6 flows through the transistors M1 to M4. The current flowing through the transistor M6 is directly supplied to the transistor M7.

Accordingly, the current at the drain terminals of the transistors M1, M3, and M6 flow through the transistors M1, M3, and M6 at a ratio of α:α:1. If the current flowing through the transistor M5 has a current value of iM5, the total current value of the currents supplied to the transistors M1, M3, and M6 is equal to the sum of the current value i1 of the constant current source 21 and the current value iM5. Thus, when the current flowing through the transistor M6 has a current value of iM6, the following equation (1) is satisfied.

$$i1 + iM5 = iM6 \times (2\alpha + 1) \quad (1)$$

Figure 6:
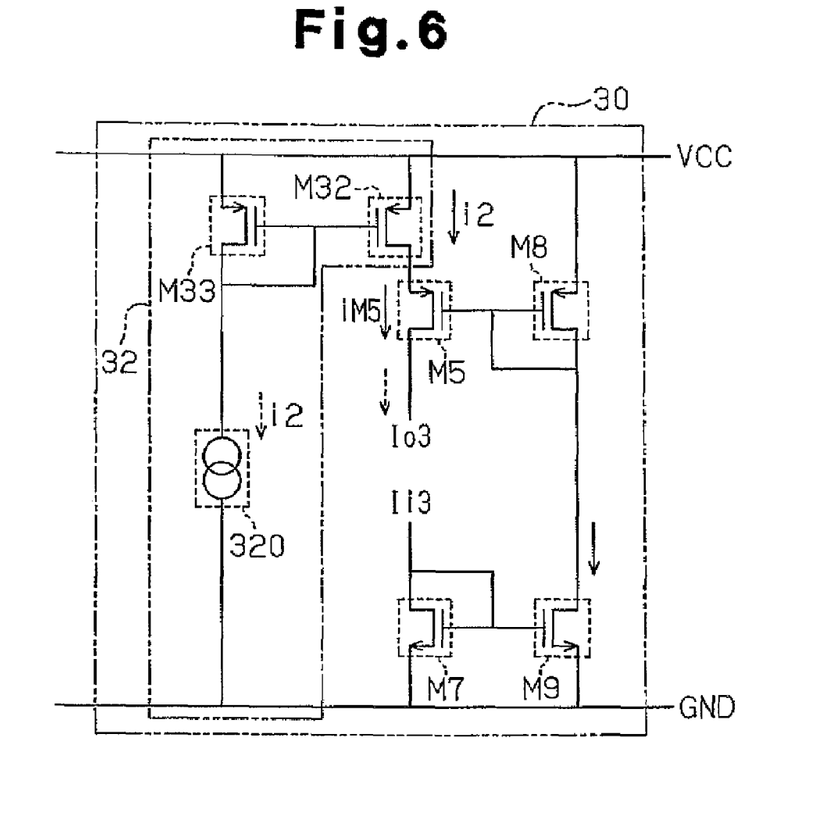
FIG. 6 is a circuit diagram of a nonlinear amplification circuit in the third range III.

The current value iM5 of the current flowing through the transistor M5 will now be described with reference to FIG. 6, which shows the nonlinear amplification circuit unit 30 of the comparator circuit 10. In FIG. 6, the constant current source 32 is formed by transistors M32 and M33 and a constant current source 320. The transistors M32 and M33 are p-channel MOS transistors having the same size. The source terminals of the transistors M32 and M33 are connected to the power supply voltage VCC line. The gate terminals of the transistors M32 and M33 are connected to each other and to the drain terminal of the transistor M33. Accordingly, the transistors M32 and M33 form a current mirror circuit. The drain terminal of the transistor M33 is connected to the ground voltage GND line via the constant current source 320, through which current having current value i2 flows. Further, the drain terminal of the transistor M32 is connected to the source terminal of the transistor M5 in the nonlinear amplification circuit unit 30. This structure of the constant current source 32 enables recognition of the input and output characteristics of the nonlinear amplification circuit unit 30 that can actually be designed.

Figure 7:
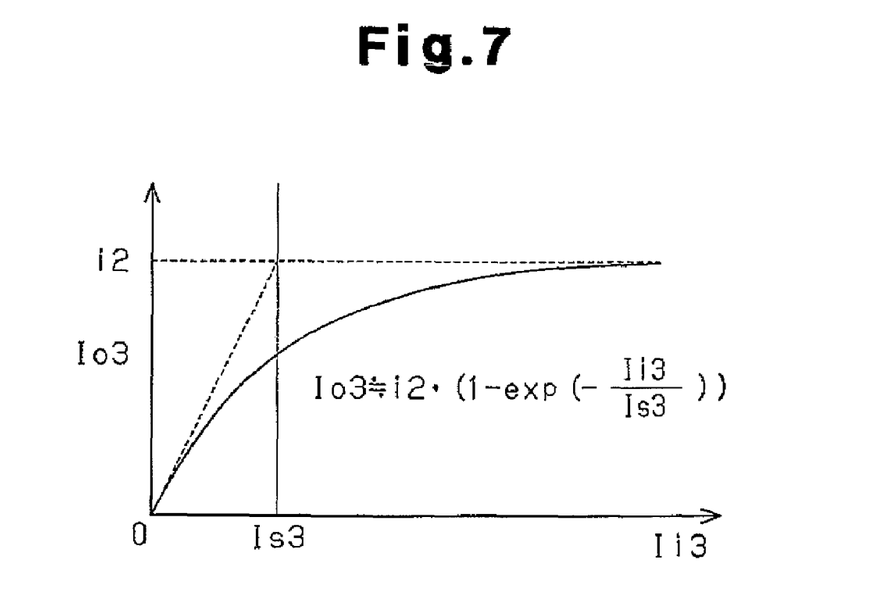
FIG. 7 is a graph showing the relationship of the output current and input current in the nonlinear amplification circuit.

FIG. 7 shows the input and output characteristics of the output current Io3 of the nonlinear amplification circuit unit 30 that flows through the transistor M5 relative to the input current Ii3 of the nonlinear amplification circuit unit 30 supplied to the drain terminal of the transistor M7. As shown in FIG. 7, when the input current Ii3 is "0", the output current Io3 is also "0". If the influence of the transistor M32 is ignorable, a gradual increase in the input current Ii3 increases the output current Io3 along a straight line having an inclination of i2/Is3. The inclination, which is based on the transistor size ratio, is [transistor M9]/[transistor M7]×[transistor MS]/[transistor M8]. The brackets ([ ]) represent the area. In the present embodiment, the transistor M9 is N times larger than the transistor M7. Further, the transistor M5 has the same size as the transistor M8. Thus, the inclination i2/Is3 is "N".

If the influence of the transistor M32 is not ignorable, a value taking into consideration the ON resistance of the drain-source voltage of the transistor M32 is calculated from the operation of the current mirror circuits formed by the transistors M7, M9, M8, and M5. This obtains the input and output characteristics of the output current Io3 relative to the input current Ii3.

More specifically, as the input current Ii3 increases, the current restriction imposed by the transistor M32 becomes effective and causes the inclination i2/Is3 to deviate from a straight line. The transistor M32 is a constant current source. Thus, the value of the current flowing through the transistor M5, which is connected to the transistor M32, cannot exceed the current value i2 of the transistor M32. Accordingly, the inclination becomes asymptotic to current value i2 when the input current Ii3 is large. Thus, the input and output characteristic of the output current Io3 relative to the input current Ii3 may be approximated from the equation shown below.

$$Io3 \approx i2 \times [1 - \exp(-Ii3/Is3)] \quad (2)$$

In the comparator circuit 10 of the preferred embodiment, the current corresponding to the input current Ii3 of the nonlinear amplification circuit unit 30 is the current flowing through the transistor M6 having current value iM6. The current corresponding to the output current Io3 is the current flowing through the transistor M5 having current value iM5. Accordingly, the equation shown below is satisfied.

$$iM5 = i2 \times [1 - \exp(-iM6/Is3)] \tag{3}$$

The equation shown below is satisfied when assigning the relationship of equation (1) to the current value iM6 in equation (3).

$$iM5 = i2 \times [1 - \exp(-(i1 + iM5)/Is3 \times (2\alpha + 1))] \tag{4}$$

Figure 8:
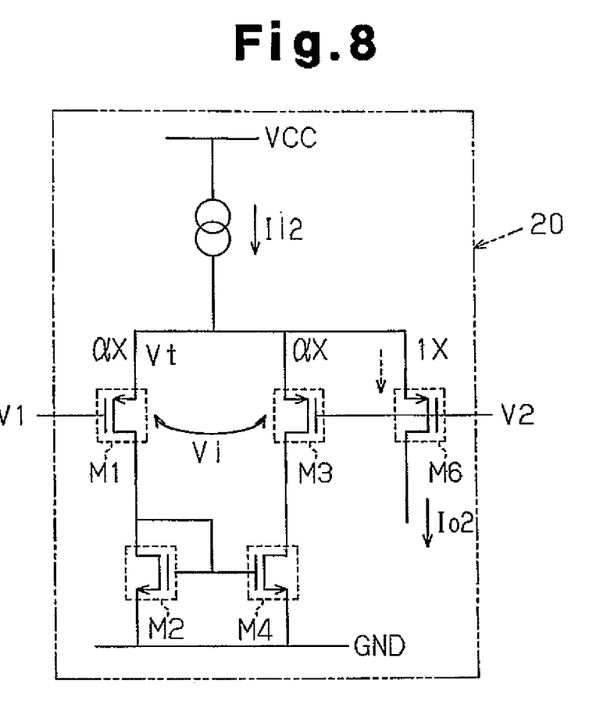
FIG. 8 is a circuit diagram of a comparison core circuit in the third range III.
Figure 9:
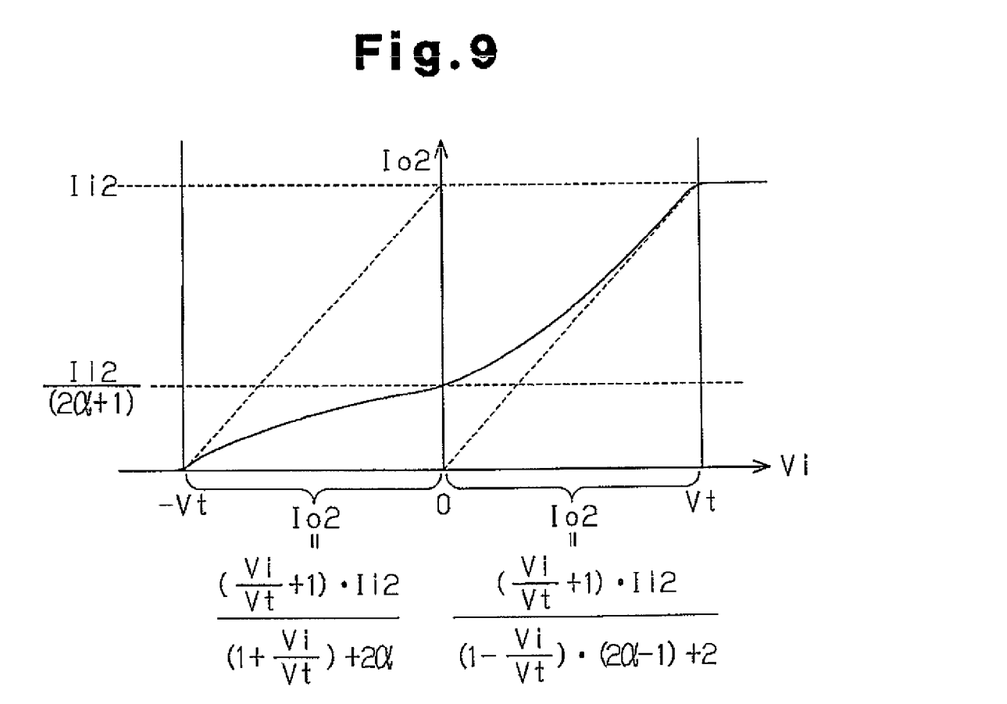
FIG. 9 is a graph showing the relationship of the output current and voltage difference in the nonlinear amplification circuit.

The current flowing to the comparison core circuit unit 20 will now be described with reference to FIGS. 8 and 9. The sum of the currents supplied to the drain terminals of the transistors M1, M3, and M6 is represented by Ii2, and the current flowing through the drain terminal of the transistor M6 is represented by Io2.

A state in which the voltage difference Vi between the input terminals is greater than 0 (voltage V1>voltage V2) will be described. If the transistors M2 and M4 were to be eliminated, the voltage difference relationship between the source and gate would cause the current flowing through the transistor M3 to be greater than the current flowing through the transistor M1. This circuit includes the transistors M2 and M4. Thus, the current flowing through the transistor M3 is restricted to the same current as that flowing through the transistor M1. The current value of the current flowing through each of the transistors M1 and M3 is represented by Ia.

Further, when assuming that the transistor M1 is divided into transistors M1a and M1b and that the size of the transistor M1a is 1/α the size of the transistor M1, or equal to the size of the transistor M6, the total ratio of the current flowing through the transistors M1 and M3 is "2α". Thus, it can be assumed that current having a ratio of "2α−1" flows to the transistor M1b and the transistor M3.

When observing only the transistor M1a and the transistor M6, the sum of the current flowing through the transistors M1a and M6 is represented by Ib. In this case, the transistor M1a and the transistor M6 form a differential amplifier and divide the current having the current value Ib. Thus, in the third range III of FIG. 2, the current Io2 flowing through the transistor M6 is Ib/2 when Vi=0 is satisfied and may be approximated with a straight line in which the current is Ib when Vi=Vt is satisfied. In the third region III, the current value Ia of the current flowing through the transistor M1a is Ib/2 when Vi=0 is satisfied and may be approximated with a straight line in which the current is 0 when Vi=Vt is satisfied.

Accordingly, the equations shown below can be obtained.

$$Io2 = (Ib/2) \cdot (1 + Vi/Vt) \tag{5}$$

$$Ia = (Ib/2) \cdot (1 - Vi/Vt) \tag{6}$$

Current value Ib is obtained by excluding the current flowing through the transistors M1b and M3 from the total current Ii2 and thus may be represented as shown below.

$$Ib = Ii2 - Ia \cdot (2\alpha - 1) \tag{7}$$

The above equation (5) may be deformed to Ib=2·Io2/(1+Vi/Vt). By assigning Ib of this equation and Ia of equation (6) to equation (7), the equation shown below is obtained.

$$Io2 = [(Vi/Vt + 1) \cdot Ii2] / [(1 - Vi/Vt) \cdot (2\alpha - 1) + 2] \tag{8}$$

A state in which the voltage difference Vi between the input terminals is less than 0 (voltage V1<voltage V2) will be described. If the transistors M2 and M4 were to be eliminated, the voltage difference relationship between the source and gate would cause the current flowing through the transistor M1 to be greater than the current flowing through the transistor M3. This would not restrict the current flowing through the transistor M3 even if the transistors M2 and M4 existed. Accordingly, the current flowing through the transistor M3 is α times greater than the current Io2 flowing through the transistor M6. The current value of the current flowing through the transistor M1 is represented by Ic.

Further, when assuming that the transistor M1 has the same size as the transistor M3, the ratio of the current flowing through each of the transistors M1 and M3 is α and the same.

When observing only the transistor M1 and M3, the sum of the current flowing through the transistors M1 and M3 is represented by Id. In this case, the transistor M1 and the transistor M3 form a differential amplifier and divide the current having the current value Id. Thus, in the third range III of FIG. 2, the current (α·Io2) flowing through the transistor M3 is 0 when Vi=−Vt is satisfied and may be approximated with a straight line in which the current is Id/2 when Vi=0 is satisfied. In the third region III, the current value Ic of the current flowing through the transistor M1 is Ic when Vi=−Vt is satisfied and may be approximated with a straight line in which the current is Id/2 when Vi=0 is satisfied.

Accordingly, the equations shown below can be obtained.

$$\alpha \cdot Io2 = (Id/2) \cdot (Vi/Vt + 1) \tag{9}$$

$$Ic = (Id/2) \cdot (Vi/-Vt + 1) \tag{10}$$

Current value Id is obtained by excluding the current flowing through the transistor M6 from the total current Ii2 and thus may be represented as shown below.

$$Id = Ii2 - Io2 \tag{11}$$

The above equation (9) may be deformed to Id=2·α·Io2/(Vi/Vt+1). By assigning Id of this equation to equation (11), the equation shown below is obtained.

$$Io2 = [(Vi/Vt + 1) \cdot Ii2] / [(1 + Vi/Vt) + 2\alpha] \tag{12}$$

Figure 10:
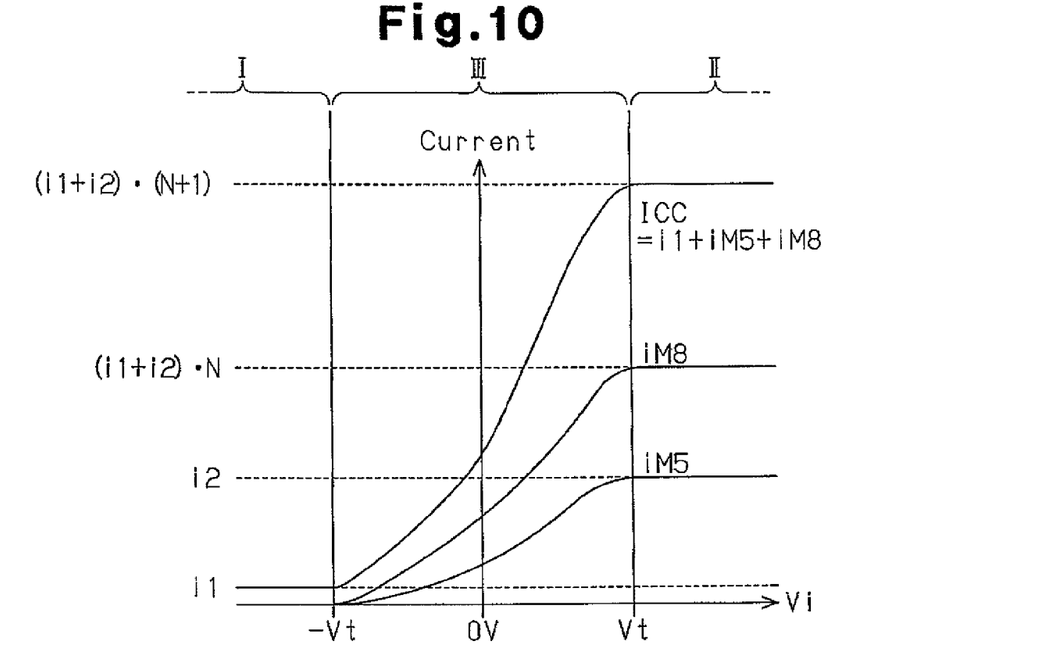
FIG. 10 is a graph showing current changes in the comparator circuit when in the third range III.

The current value Ii2 is the sum of the current value i1 and the current value iM5. The current Io2 is the output current Io3 of the nonlinear amplification circuit unit 30. Thus, the current value iM5 of the current flowing through the transistor M5 is obtained by multiplying the coefficients of the equations (4) and (8) when the voltage difference Vi is greater than 0 and obtained by multiplying the coefficients of the equations (4) and (12) when the voltage difference Vi is smaller than 0. Thus, the current value iM5 is varied as shown in FIG. 10. The current value iM8 of the current flowing through the transistor M8 is N times greater than that of the transistor M6 and thus varies as shown in FIG. 10. The consumption current ICC of the comparator circuit 10 is the sum of the current values i1, iM5, and iM8 and varies as shown in FIG. 10.

As apparent from FIG. 10, the current flowing through the transistor M5 is amplified as a gradually varying nonlinear curve. The comparison core circuit unit 20 is supplied with current having current value (i1+i5), which changes the bias. Accordingly, when the voltage difference Vi=0 is supplied, the comparison core circuit unit 20 is supplied with sufficient current.

The preferred embodiment has the advantages described below.

In the preferred embodiment, the comparator circuit 10 includes the comparison core circuit unit 20, the monitor circuit unit formed by a transistor core M6, and the nonlinear amplification circuit unit 30. The nonlinear amplification circuit unit 30 amplifies the monitor current supplied from the transistor M6 in a nonlinear manner and supplies the comparison core circuit unit 20 with current. The current amplified by the nonlinear amplification circuit unit 30 is supplied to the comparison core circuit unit 20 and the transistor M6. Based on this current, the transistor M6 causes the flow of current. This gradually increases the current supplied to the comparison core circuit unit 20 in the third range III, as shown in FIG. 10, and suppresses the generation of glitches. Further, due to the nonlinear amplification circuit unit 30, the current supplied to the comparison core circuit unit 20 is significantly increased at the switching potential (Vi=0) of the low level and the high level. Accordingly, when current does not flow to the transistor M3, a large current that does not lower the response speed is supplied in the vicinity of the switching potential even if current does not flow to the transistor M3. This enables current to be decreased in order to reduce consumption current.

In the preferred embodiment, the source terminal and gate terminal of the transistor M6 are respectively connected to the source terminal and gate terminal of the transistor M3. Thus, the transistor M6 is activated and deactivated synchronously with the transistor M3. Accordingly, when the transistor M3 is deactivated and current does not flow to the transistor M3, the transistor M6 is also deactivated and current does not flow to the transistor M6. This further reduces current consumption.

In the preferred embodiment, the constant current source 21 of the comparison core circuit unit 20 is connected to the ground voltage GND line via the transistors M1 and M2 or via the transistors M3 and M4. The gate terminals of the transistors M3 and M4 are respectively supplied with the voltages V1 and V2. Thus, when the transistor M3 is deactivated, current having the current value i1 and generated by the constant current source 21 flows to the comparison core circuit unit 20. Accordingly, the consumption current may be efficiently reduced by setting the current value i1 to a small value.

In the preferred embodiment, the transistor M6, which forms the monitor circuit unit, is $1/\alpha$ the size of the transistor M3 of the comparison core circuit unit 20. When a is greater than 1, current mainly flows to the transistors M1 and M3. This increases the current that flows to comparison core circuit unit 20 and prevents the response speed from being decreased.

In the preferred embodiment, the nonlinear amplification circuit unit 30 includes the second current mirror circuit formed by the transistors M7 and M9, the third current mirror circuit formed by the transistors M8 and M5, and the constant current source 32 connected to the transistor M5. Further, the transistor M5 is connected to the source terminals of the transistors M1, M3, and M6. This structure amplifies the current flowing through the transistor M6 with the second current mirror circuit and the third current mirror circuit and supplies the comparison core circuit unit 20 and the transistor M6 with the amplified current. Thus, a feedback loop is formed, and the nonlinear amplification circuit unit 30 outputs current, which is balanced by the feedback relative to the input current. Accordingly, the nonlinear amplification circuit unit 30, which has a relatively simple structure, outputs gradually varying current in a transitional state.

It should be apparent to those skilled in the art that the present invention may be embodied in many other specific forms without departing from the spirit or scope of the invention. Particularly, it should be understood that the present invention may be embodied in the following forms.

Figure 11:
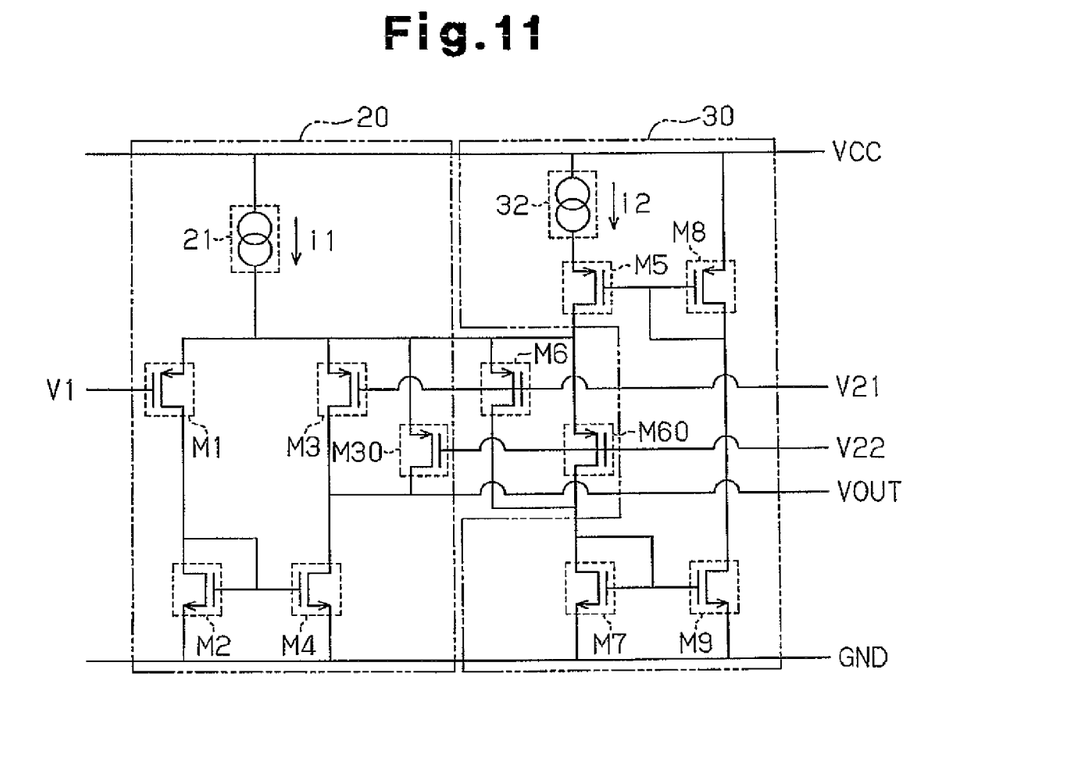
FIG. 11 is a circuit diagram of a comparator circuit according to a further embodiment of the present invention.

In the preferred embodiment, the comparator circuit 10 has a single negative input terminal. However, the present invention is not limited in such a manner, and the comparator circuit 10 may have a plurality of negative input terminals, each supplied with a different second voltage V2. This enables the comparison of a plurality of second voltages V2 with the first voltage V1 at the positive input terminal. In this case, the comparison core circuit unit 20 is further provided with a transistor supplied with the second voltage, and a transistor serving as a monitor circuit unit is provided in correspondence with the transistor supplied with the second voltage. More specifically, as shown in FIG. 11, the comparison core circuit unit 20 includes a transistor M30, which is formed by a p-channel MOS transistor. In the same manner as the transistor M3, the transistor M30 includes a source terminal connected to the constant current source 21 and a drain terminal connected to the output terminal. Further, the gate terminal of the transistor M30 is connected to a negative input terminal for voltage V22 that differs from voltage V21 of a negative input terminal connected to the gate terminal of the transistor M3. In addition, the monitor circuit unit further includes a transistor M60, which is formed by a p-channel MOS transistor. In the same manner as the transistor M6, the transistor M60 includes a source terminal connected to the source terminal of the transistor M6 and a drain terminal connected to the drain terminal of the transistor M7. Further, the gate terminal of the transistor M60 is commonly shared with the gate terminal of the corresponding transistor M30.

Accordingly, in the same manner as the operation performed by the transistor M6 in accordance with the current flowing through the transistor M3, the transistor M60 performs an operation that is in accordance with the current flowing through the transistor M30. Therefore, when the transistors M3 and M30 are in a transitional state in the third range III, current is gradually increased. This suppresses the generation of glitches and supplies the comparison core circuit unit 20 with sufficient current Thus, current consumption is reduced when current does not flow to the transistors M3 and M30. Further, when the transistors M3 and M30 are deactivated, current does not flow to the corresponding transistors M6 and M60. This further reduces current consumption.

The comparator circuit shown in FIG. 11 has two negative input terminals. However, the present invention is not limited in such a manner, and more negative input terminals may be provided. In this case, each negative input terminal is supplied with a second voltage, which is compared with the voltage V1 at the positive input terminal.

In the preferred embodiment, in the second range II, the comparator circuit 10 consumes the total current of the constant current sources 21 and 32 (i1+i2) and the total current of the currents flowing through the transistors M8 and M9 (N·(i1+i2)). However, the present invention is not limited in such a manner. Depending on the circuit that uses the comparator circuit 10, the second range II may be a range for low current consumption in the same manner as the first region I. For example, the comparator circuit may be such that current varies in a laterally symmetric manner about Vi=0 in FIG. 10.

The present examples and embodiments are to be considered as illustrative and not restrictive, and the invention is not to be limited to the details given herein, but may be modified within the scope and equivalence of the appended claims.

The invention claimed is:

1. A comparator including a comparison core circuit unit having an output terminal for varying an output level in accordance with a voltage difference between a first voltage input to a gate terminal of a first transistor and a second voltage input to a gate terminal of a second transistor, the comparator comprising:

a monitor circuit unit for outputting monitor current in accordance with the amount of current flowing through the second transistor in a transitional state in which the current amount changes and for stopping the flow of the monitor current when the second voltage is higher than the first voltage and current does not flow to the second transistor, wherein the monitor circuit unit includes a transistor having a gate terminal commonly shared with a gate terminal of the second transistor and a source terminal commonly shared with a source terminal of the second transistor, the transistor being smaller in size than the second transistor;

a nonlinear amplification circuit unit for increasing the monitor current in a nonlinear manner and adding a bias for operating the comparison core circuit unit; and a plurality of second terminals, each inputting a different one of the second voltage, wherein the comparison core circuit unit includes the second transistor for each of the second terminals, and the monitor circuit unit includes a transistor for each of the second transistors, each transistor having a gate terminal and a source terminal commonly shared with the gate terminal and the source terminal of the associated one of the second transistors, and each transistor having a drain terminal connected to the first current mirror circuit.

2. The comparator circuit according to claim 1, wherein the comparison core circuit unit includes:

a first constant current source; and a first current mirror circuit of which input current is the current flowing through the first transistor and output current is the current flowing through the second transistor;

wherein the output terminal is a connection node of the second transistor and the first current mirror circuit.

3. The comparator circuit according to claim 2, wherein the nonlinear amplification circuit unit includes:

a second current mirror circuit of which input current is the current flowing through the monitor circuit unit;

a third current mirror circuit of which input current is an output current of the second current mirror circuit; and a second constant current source connected to an output side transistor of the third current mirror circuit, wherein the output side transistor is connected to the source terminals of the first transistor and the second transistor.

* * * * *